(12) United States Patent  
Zhang et al.

(10) Patent No.: US 11,830,434 B2  
(45) Date of Patent: Nov. 28, 2023

(54) DISPLAY PANEL AND DISPLAY DEVICE (71) Applicants: Chengdu BOE Optoelectronics Technology Co., Ltd., Sichuan (CN); BOE Technology Group Co., Ltd., Beijing (CN)

(72) Inventors: Xin Zhang, Beijing (CN); Yang Zhou, Beijing (CN); Yi Qu, Beijing (CN); Dongxiao Shan, Beijing (CN); Yi Zhang, Beijing (CN); Linhong Han, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/770,421

(22) PCT Filed: Jul. 5, 2021

(86) PCT No.: PCT/CN2021/104557  
§ 371 (c)(1),  
(2) Date: Apr. 20, 2022

(87) PCT Pub. No.: WO2022/028186  
PCT Pub. Date: Feb. 10, 2022

(65) Prior Publication Data  
US 2022/0392408 A1 Dec. 8, 2022

(30) Foreign Application Priority Data

Aug. 4, 2020 (CN) .......................... 202010771345.2

(51) Int. Cl.  
*G09G 3/3266* (2016.01)  
*H10K 59/131* (2023.01)

(52) U.S. Cl.  
CPC ......... *G09G 3/3266* (2013.01); *H10K 59/131* (2023.02); *G09G 2300/0426* (2013.01);  
(Continued)

(58) Field of Classification Search  
CPC .......................... H10K 59/131; G09G 3/3266  
See application file for complete search history.

(56) References Cited

U.S. PATENT DOCUMENTS 10,559,603 B2 * 2/2020 Chen ...................... H10K 50/00  
2012/0146059 A1 6/2012 Moon et al.  
(Continued)

FOREIGN PATENT DOCUMENTS

CN 102569339 A 7/2012  
CN 105932029 A 9/2016  
(Continued)

*Primary Examiner* — Sardis F Azongha  
(74) *Attorney, Agent, or Firm* — IPro, PLLC (57) ABSTRACT

Provided is a display panel. The display panel is provided with a display region and a peripheral region surrounding the display region, and includes: a substrate; a drive circuit, disposed on the substrate; and a plurality of first signal pins, disposed on the substrate and spaced apart in the peripheral region, wherein the plurality of first signal pins are electrically connected to the drive circuit; wherein the plurality of first signal pins include at least two first pins, the at least two first pins being electrically connected.

20 Claims, 5 Drawing Sheets

(52) U.S. Cl.
CPC ............... *G09G 2310/0297* (2013.01); *G09G 2320/0233* (2013.01); *G09G 2330/021* (2013.01)

(56) References Cited

U.S. PATENT DOCUMENTS

| | | | |
|---|---|---|---|
| 2015/0144915 A1* | 5/2015 | Lee | G02F 1/136204 |
| | | | 257/40 |
| 2018/0190182 A1* | 7/2018 | Li | G09G 3/22 |
| 2019/0245283 A1* | 8/2019 | Oh | G06F 3/041 |
| 2020/0098795 A1* | 3/2020 | Jung | H01L 23/528 |
| 2021/0074733 A1 | 3/2021 | Huang | |
| 2021/0202906 A1* | 7/2021 | Kim | H10K 59/10 |

FOREIGN PATENT DOCUMENTS

| | | | |
|---|---|---|---|
| CN | 107765483 A | 3/2018 | |
| CN | 108844719 A | 11/2018 | |
| CN | 111883569 A | 11/2020 | |
| KR | 20080019985 A | 3/2008 | |

\* cited by examiner

DISPLAY PANEL AND DISPLAY DEVICE

CROSS-REFERENCE TO RELATED APPLICATION

This application is a US national phase application based on PCT/CN2021/104557, filed on Jul. 5, 2021, which claims priority to Chinese Patent Application No. 202010771345.2, filed on Aug. 4, 2020 and entitled "DISPLAY PANEL AND DISPLAY DEVICE", the disclosures of which are incorporated herein by reference in their entireties.

TECHNICAL FIELD

The present disclosure relates to the field of displays, in particular to a display panel and a display device.

BACKGROUND

A display panel includes a display region provided with pixels, and a peripheral region. The display panel further includes a drive circuit for controlling light emission of the pixels. The peripheral region is provided with a drive integrated circuit (IC) and signal pins that are connected to pins of drive integrated circuit one to one. A first signal pin among the signal pins is electrically connected to the drive circuit via a trace.

A signal provided by IC is output to the drive circuit via the first signal pin and the trace, such that the display panel is controlled to display a screen.

SUMMARY

Embodiments of the present disclosure provide a display panel and a display device, such that the stability of the signals in the display panel and the display effect are improved. The technical solutions are as follows.

In one aspect, the present disclosure provides a display panel that is provided with a display region and a peripheral region surrounding the display region. The display panel includes:
  a substrate;
  a drive circuit, disposed on the substrate; and
  a plurality of first signal pins, disposed on the substrate and spaced apart in the peripheral region, wherein the plurality of first signal pins are electrically connected to the drive circuit;
  wherein the plurality of first signal pins include at least two first pins, wherein the at least two first pins are electrically connected.

In an embodiment of the present disclosure, the display panel further includes:
  a first trace, wherein one end of the first trace is electrically connected to one of the first pin, and the other end of the first trace is electrically connected to the other one of the first pins.

In an embodiment of the present disclosure, the drive circuit includes a plurality of sub-circuits;
  the first pins that are electrically connected are connected to different sub-circuits via a same second trace, or
  the first pins that are electrically connected are electrically connected to different sub-circuits via different second traces.

In an embodiment of the present disclosure, the display panel includes at least two electrode layers sequentially laminated and insulated from each other, wherein the at least two electrode layers are disposed on the substrate; and the first trace is disposed on any one of the at least two electrode layers.

In an embodiment of the present disclosure, the at least two electrode layers include a first gate layer, a second gate layer and a source-drain layer.

In an embodiment of the present disclosure, the first pin is a vertical shift register pin; and
  the drive circuit includes a switch circuit, wherein the switch circuit is disposed on the substrate and in the peripheral region, and the vertical shift register pin is electrically connected to the switch circuit.

In an embodiment of the present disclosure, the plurality of first signal pins include 30 vertical shift register pins.

In an embodiment of the present disclosure, the first pin is a gate drive switch pin; and
  the drive circuit includes a gate driver on array, wherein the gate driver on array is disposed on the substrate and in the peripheral region, and the gate drive switch pin is electrically connected to the gate driver on array.

In an embodiment of the present disclosure, the plurality of first signal pins include 20 gate drive switch pins.

In an embodiment of the present disclosure, the first pin is a light-emitting control drive switch pin; and
  the drive circuit includes a light-emitting control circuit, wherein the light-emitting control circuit is disposed on the substrate and in the peripheral region, and the light-emitting control drive switch pin is electrically connected to the light-emitting control circuit.

In an embodiment of the present disclosure, the plurality of first signal pins include 20 light-emitting control drive switch pins.

In an embodiment of the present disclosure, the plurality of first signal pins include at least two second pins, wherein the at least two second pins are connected electrically.

In an embodiment of the present disclosure, the first trace electrically connecting the at least two first pins is disposed on a different layer from a third trace electrically connecting the at least two second pins.

In an embodiment of the present disclosure, the display panel further includes:
  second signal pins, electrically connected to a flexible printed circuit, wherein the first signal pins are arranged in two rows, the second signal pin are arranged in one row, and the three rows of signal pins are arranged in parallel.

In another aspect, a display device is provided. The display device includes the display panel as defined in any one of the above aspects.

BRIEF DESCRIPTION OF THE DRAWINGS

For clearer descriptions of the technical solutions in the embodiments of the present disclosure, the accompanying drawings required for describing the embodiments will be introduced briefly hereinafter. Obviously, the accompanying drawings in the following description show merely some embodiments of the present disclosure, and persons of ordinary skill in the art may still derive other drawings from these accompanying drawings without creative efforts.

DETAILED DESCRIPTION

In order to make the purpose, technical solutions and advantages of the present disclosure clearer, the embodiments of the present disclosure will be described in detail hereinafter with reference to the accompanying drawings.

In the related art, the signal pins on a display panel are spaced apart and insulated from each other. Each of the signal pins is electrically connected to a drive circuit via the trace thereof. The traces have different resistance values caused by different lengths, resulting in different losses during the transmission of electrical signals. The electrical signals of signals pins that output a same signal and are far apart may have different losses. In this way, the electrical signals received by a drive circuit in the display panel are of different strengths, causing a poor stability of the signals.

Figure 1:
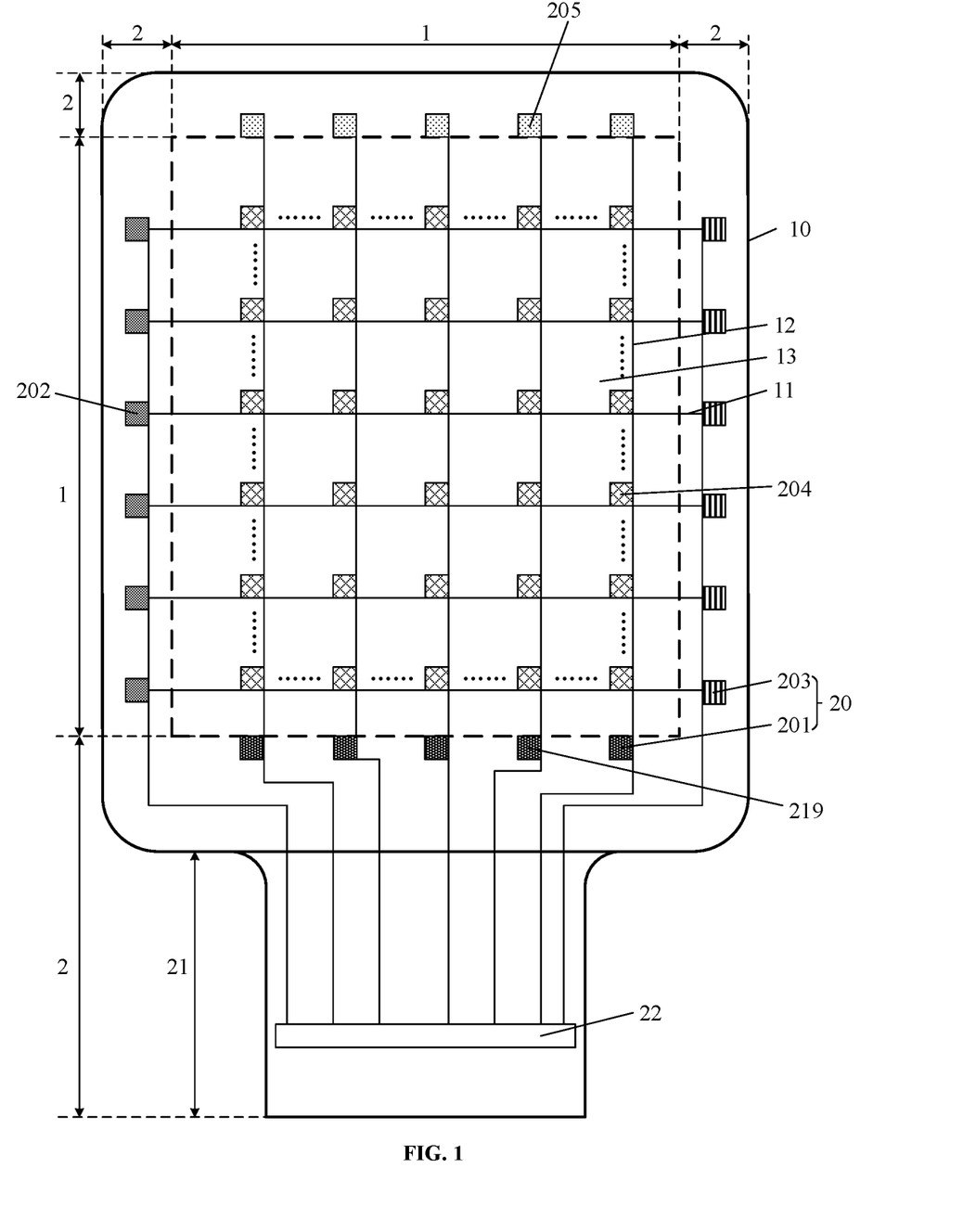
FIG. 1 is a top view of a display panel according to embodiments of the present disclosure.

FIG. 1 is a top view of a display panel according to embodiments of the present disclosure. Referring to FIG. 1, the display panel is provided with a display region 1 and a peripheral region 2 surrounding the display region 1, and the display panel includes a substrate 10.

In the embodiments of the present disclosure, the display region 1 is configured to display a screen. In some exemplary embodiments, the display region 1 includes a plurality of gate lines 11 extending in a first direction and a plurality of data lines 12 extending in a second direction, wherein the first direction and the second direction are perpendicular to each other. The plurality of gate lines 11 and the plurality of data lines 12 are intersected to define a plurality of pixel regions 13. Each of the plurality of pixel regions 13 is disposed with pixels. Each of the pixels is provided with a light-emitting element and a pixel circuit 204, wherein the light-emitting element may be an organic light-emitting diode (OLED). A drive integrated circuit 22, a switch circuit 201, a gate driver on array (GOA) 202, a light-emitting (EM) control circuit 203, various signal pins, and the like may be arranged in the peripheral region 2.

As shown in FIG. 1, the display panel includes a substrate 10 and a drive circuit 20, and the drive circuit 20 is disposed on the substrate 10. The drive circuit 20 includes the switch circuit 201, the gate driver on array 202 and the light-emitting control circuit 203 as described above.

As shown in FIG. 1, the switch circuit 201 is arranged on a side of the display region, and is electrically connected to the pixel circuit 204 via the data line 12 to provide a data signal to the pixel circuit 204.

As shown in FIG. 1, the gate driver on array 202 is disposed on a side of the display region, and the pixel circuits 204 in a same row are electrically connected to a same gate driver on array 202. The gate driver on array 202 provides a gate drive signal to the pixel circuit 204, and is electrically connected to the pixel circuit 204 via the gate line 11.

As shown in FIG. 1, the light-emitting control circuit 203 is disposed on the other side of the display region, and the pixel circuits 204 in a same row are electrically connected to a same light-emitting control circuit 203. The light-emitting control circuit 203 provides a light-emitting signal to the light-emitting element in the pixel circuit 204. The gate driver on array 202 and the light-emitting control circuit 203 are disposed on two sides of the display panel respectively.

In other embodiments, both sides of the display region may be arranged with the gate driver on array 202 and the light-emitting control circuit 203. On one side of the display panel, the gate driver on array 202 is electrically connected to even-row pixel circuits 204, and the light-emitting control circuit 203 is electrically connected to odd-row pixel circuits 204. On the other side of the display panel, the gate driver on array 202 is electrically connected to odd-row pixel circuits 204, and the light-emitting control circuit 203 is electrically connected to even-row pixel circuit 204.

As shown in FIG. 1, the peripheral region 2 is further arranged with a light-on test unit 205 for testing a circuit of the display panel during manufacturing of the display panel. The light-on test unit 205 is out of operation during display of the display panel, and thereby a corresponding pin connected to the light-on test unit 205 is not provided. As shown in FIG. 1, the light-on test unit 205 is disposed on an upper side of the display region 1.

As shown in FIG. 1, the peripheral region 2 includes a fanout region 21, and various traces on the display panel, such as data lines 12, are led out via the fanout region 21 and electrically connected to the drive integrated circuit 22.

The display panel shown in FIG. 1 is a square display panel. In other embodiments, the display panel may be in other shapes.

Figure 2:
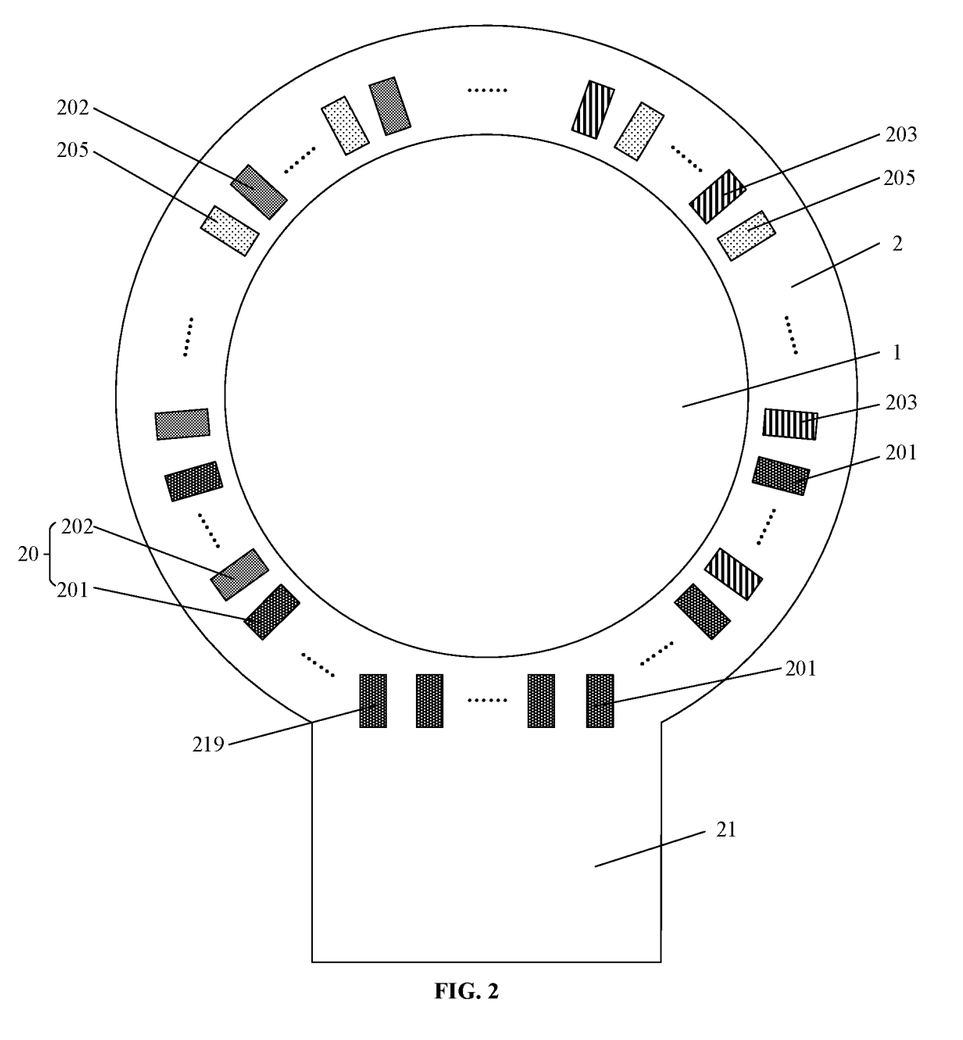
FIG. 2 is a top view of another display panel according to embodiments of the present disclosure.

FIG. 2 is a top view of another display panel according to embodiments of the present disclosure. The display panel shown in FIG. 2 is circular, and the display region 1 is also a circular display region. The gate driver on array 202 and the light-emitting control circuit 203 are arranged around the display region 1, wherein the gate driver on array 202 is disposed on a left semicircular side of the display region 1, and the light-emitting control circuit 203 is disposed on a right semicircular side of the display region 1. The light-on test unit 205 is disposed on an upper semicircular side of the display region 1. The light-on test units 205 on the right side are spaced apart and arranged between the light-emitting control circuits 203, and the light-on test unit 205 on the left side are spaced apart and arranged between the gate driver on arrays 202. One light-on test unit 205 may be provided between every two light-emitting control circuits 203, or may be provided in a fashion of spacing apart a plurality of light-emitting control circuits 203. The gate driver on array 202 and the light-on test unit 205 may be arranged in a same fashion as described above.

Figure 3:
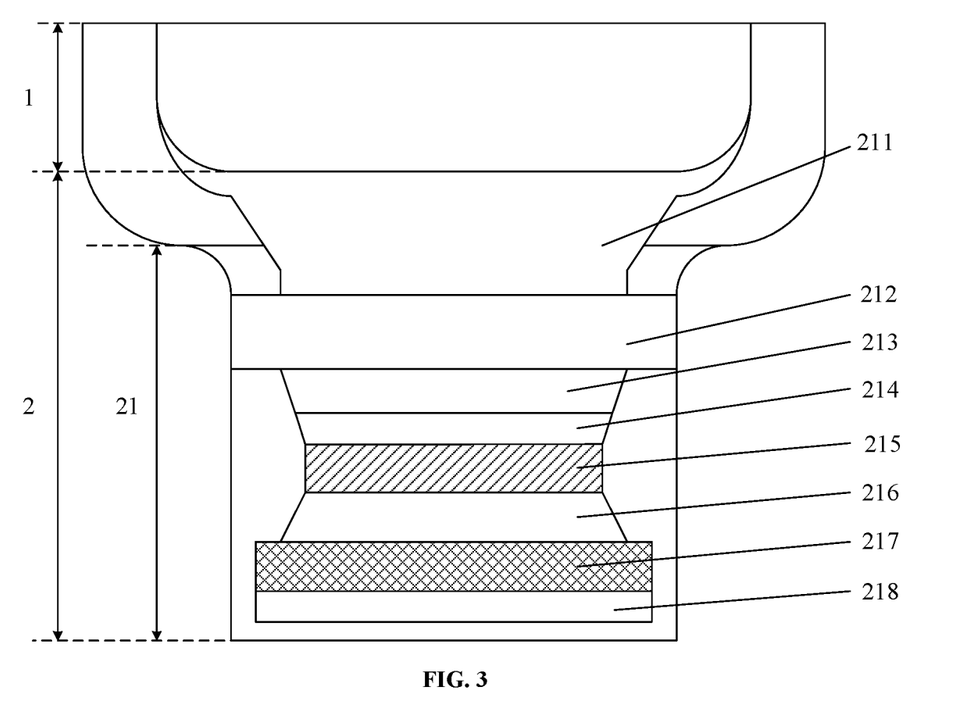
FIG. 3 is a top view of a fanout region according to embodiments of the present disclosure.

FIG. 3 is a top view of a fanout region according to embodiments of the present disclosure. Referring to FIG. 3, the fanout region 21 includes a first sub-fanout region 211, a bendable region 212, a second sub-fanout region 213, an electrostatic discharge (ESD) region 214, an IC region 215, an outer pin region 216, a circuit board region 217, and a light-on test region 218, which are sequentially connected. The first sub-fanout region 211 is connected to the display region 1. The bendable region 212 is configured to perform bending, such that the size of a bezel of the display panel is reduced. The trace is bended in the bendable region 212 and then led out from the second sub-fanout region 213. The electrostatic discharge region 214 is configured to discharge static electricity in the display panel, so as to prevent the static electricity from affecting the circuits in the display panel. The IC region 215 is arranged with the drive integrated circuit 22 therein, the circuit board region 217 is arranged with the circuit board therein, wherein pins in the drive integrated circuit 22 and pins in the circuit board are soldered in the outer pin region 216 to electrically connect the drive integrated circuit 22 to the circuit board. The light-on test region 218 is arranged with the controller controlling the light-on test unit therein. The light-on test region 218 is disposed on a side of the circuit board region 217 distal from the display region in FIG. 3. In other embodiments, the light-on test region 218 may be disposed on both sides of the circuit board region 217, which is not limited in the present disclosure.

In the embodiments of the present disclosure, the circuit board is a flexible printed circuit (FPC).

In the embodiments of the present disclosure, the driving integrated circuit 22 is disposed on the substrate 10 in a package form of chip-on-panel (COP).

In other embodiments, the drive integrated circuit 22 may also be disposed on the substrate 10 in a package form of chip-on-film.

Figure 4:
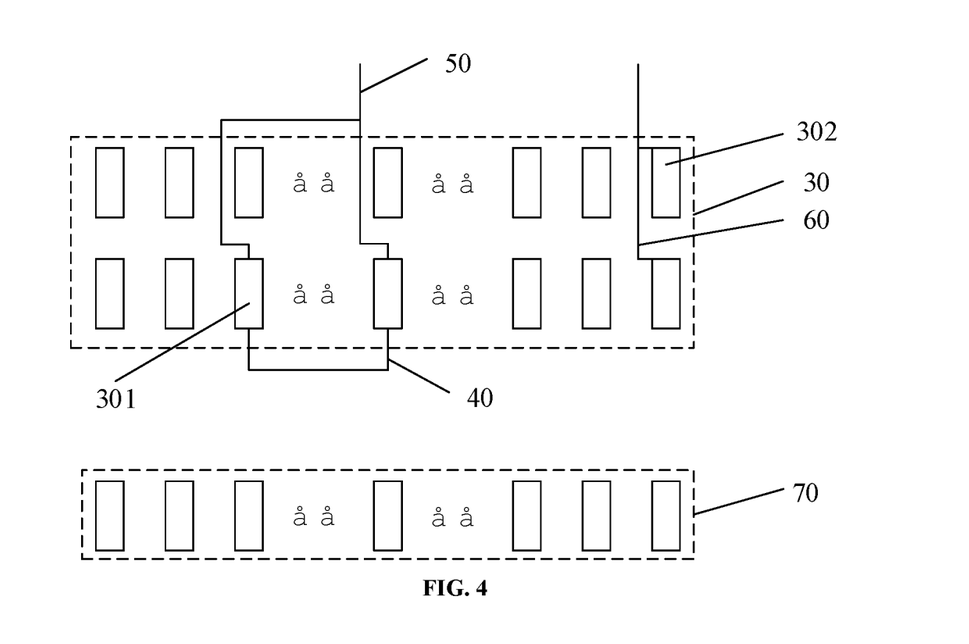
FIG. 4 is a top view of a peripheral region of a display panel according to embodiments of the present disclosure.

FIG. 4 is a top view of a peripheral region of a display panel according to the embodiments of the present disclosure. Referring to FIG. 4, the display panel further includes a plurality of first signal pins 30. The plurality of first signal pins 30 are disposed on the substrate 10, spaced apart in the peripheral region 2, and electrically connected to the drive circuit 20 (not shown in FIG. 4).

The plurality of first signal pins 30 include at least two first pins 301, and the at least two first pins 301 are connected electrically.

In the embodiments of the present disclosure, the plurality of first signal pins 30 are electrically connected to output pins on the drive integrated circuit in one-to-one correspondence. At least two first pins 301 among the plurality of first signal pins 30 are connected electrically. The drive integrated circuit outputs a same signal to the at least two first pins 301, and then transmits signals of the at least two first pins 301 to the drive circuit 20. The drive circuit is electrically connected to the light-emitting element in the pixel region and controls the light-emitting element to emit light, such that the display panel are controlled to display a screen. The at least two first pins 301 are electrically connected, such that voltage signals output to the drive circuit 20 by the at least two first pins 301 are balanced. In this way, a voltage signal output to the light-emitting element by the drive circuit is balanced, which improves the uniformity and stability of the voltage signal. As a result, the display effect of the display panel is improved.

In the embodiments of the present disclosure, at least two first pins 301 are electrically connected, which indicates that all of the first pins 301 are electrically connected, or some of the first pins 301 are electrically connected.

In the embodiments of the present disclosure, the first signal pins 30 are pads, and the output pins on the drive integrated circuit are also pads. The first signal pins 30 and the output pins on the drive integrated circuit may be connected by soldering.

Referring to FIG. 4 again, the at least two first pins 301 are electrically connected to each other via a first trace 40.

In this embodiment, the first trace 40 is arranged on the display panel, and at least two first pins 301 are electrically connected via the first trace 40, which is more convenient.

In an embodiment of the present disclosure, the first trace 40 is disposed on a same layer as the first pins 301.

In this embodiment, in a case that the first trace 40 is disposed on a same layer as the first pins 301, the first trace 40 may be manufactured when the first pins 301 are manufactured, such that the manufacturing of the first trace 40 is more convenient.

In another embodiment of the present disclosure, the first trace 40 is disposed on a different layer from the first pins 301.

In this embodiment, in a case that the first trace 40 is disposed on a different layer from the first pins 301, the first trace 40 and the first pin 301 may be arranged on different film layers of the display panel. Distances between the first pins 301 are relatively small in a case that a plurality of first pins 301 are provided. Therefore, arranging the first trace 40 and the first pins 301 on different layers, on the one hand, facilitates manufacturing, and on the other hand, avoids the first trace 40 being electrically connected to other pin, which affects transmission of signals.

In the embodiments of the present disclosure, in a case that the first trace 40 is disposed on a same layer as the first pins 301, the first trace 40 is directly electrically connected to the first pins 301. In a case that the first trace 40 is in a different layer from the first pins 301, the first trace 40 and the first pin 301 may be electrically connected to each other by a via hole.

In the embodiments of the present disclosure, the drive circuit 20 includes a plurality of sub-circuits. Referring to FIG. 4 again, the display panel further includes a second trace 50. The first pins 301 that are connected electrically are electrically connected to different sub-circuits via a same second trace 50. The two sub-circuits may be two gate driver on arrays or different pixel circuits.

In the embodiments of the present disclosure, the at least two first pins 301 are led out via a same second trace 50 and electrically connected to the drive circuit 20, such that traces have a small difference in length and thereby a small difference in resistance value. In this case, the difference in electrical signals transmitted by the trace to the drive circuit 20 is relatively small, which improves the uniformity and stability of the electrical signals. As a result, the display effect of the display panel is improved. In addition, the two first pins 301 are led out via a same second trace 50, such that the total length of the trace connected to the two first pins 301 is reduced. In this way, the power consumed by the trace and load are reduced.

In another embodiment of the present disclosure, the first pins 301 that are connected electrically are electrically connected to different sub-circuits via different second traces 50. That is, each of the first pins 301 is led out via a different trace and electrically connected to the drive circuit 20. The first pins 301 are already electrically connected, such that voltage signals output to the drive circuit 20 by the first pins 301 are balanced. In this way, a voltage signal output to the light-emitting element by the drive circuit 20 is balanced, which improves the uniformity and stability of the voltage signal. As a result, the display effect of the display panel is improved.

In the embodiments of the present disclosure, the first trace 40 and the second traces 50 may be disposed on a same layer or different layers, which is not limited in the present disclosure.

As shown in FIG. 4, the plurality of first signal pins 30 further include at least two second pins 302, and the at least two second pins 302 are connected electrically.

In the embodiments of the present disclosure, a plurality of pins (e.g., a first pin 301 and a second pin 302) outputting a same signal on the display panel are provided. The plurality of pins outputting a same signal are electrically connected to each other, such that the stability of the plurality of signals is improved. As a result, the display uniformity of the display panel is further improved.

As shown in FIG. 4, the display panel further includes a plurality of second signal pins 70 that are electrically connected to the flexible printed circuit. The first signal pins 30 are arranged in two rows, the second signal pins 70 are arranged in one row, and the three rows of signal pins are arranged in parallel.

In the embodiments of the present disclosure, the signal pins are arranged on the substrate 10 in three rows. The first signal pins 30 are in the first row and the second row, and are electrically connected to the drive circuit 20. The second signal pin 70 are in the third row, and are electrically connected to the flexible printed circuit. The signal pins are uniformly distributed on the substrate 10 to facilitate trace layout.

In the embodiments of the present disclosure, the second signal pin 70 is also electrically connected to an input pin on the drive integrated circuit. The second signal pin 70 is a pad, and the input pin on the drive integrated circuit is also a pad. The second signal pin 70 and the input pin on the drive integrated circuit may be electrically connected by soldering. The second signal pin 70 is electrically connected to the flexible printed circuit via a trace.

Figure 5:
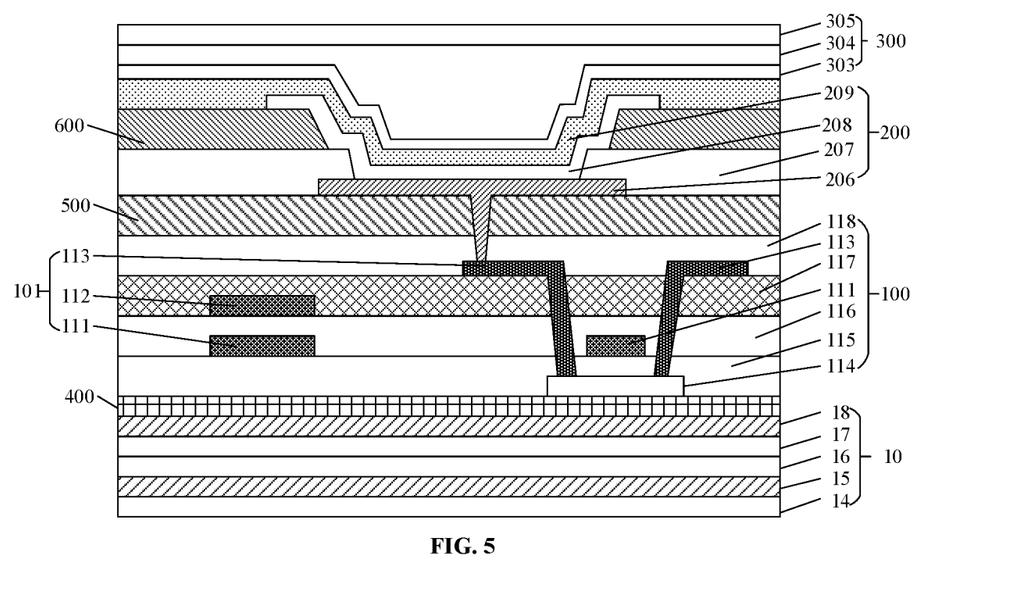
FIG. 5 is a cross-sectional view of a display region of a display panel according to embodiments of the present disclosure.

FIG. 5 is a cross-sectional view of a display region of a display panel according to embodiments of the present disclosure. Referring to FIG. 5, the display panel includes at least two electrode layers 101. The at least two electrode layers 101 are sequentially laminated on the substrate 10, and are insulated from each other.

The first trace 40 is disposed on any one of the at least two electrode layers 101.

In the embodiments of the present disclosure, the first trace 40 is arranged on the electrode layer 101 of the display panel. The first trace 40 may be manufactured when the electrode layer 101 is manufactured. In this way, the manufacturing process of the first trace 40 is relatively convenient, and requires no additional film layer to arrange the first trace 40 thereon. As a result, the thickness of the display panel is reduced, which is beneficial to the portability of the device.

As shown in FIG. 5, the display region of the display panel includes a substrate 10, a thin film transistor (TFT) array 100, a light-emitting layer 200 and a packaging layer 300 that are sequentially laminated.

The substrate 10 provides support for internal film layers of the display panel, and the thin film transistor array 100 is arranged with TFTs that are electrically connected to the gate driver on array. The gate driver on array provides gate drive signals to the TFTs, and the drive integrated circuit provides data signals to the TFTs, such that the TFTs are controlled to be turned on. In this way, the light-emitting layer 200 is controlled to emit light, so as to enable the display panel to display a screen. The substrate 10, the thin film transistor array 100 and the light-emitting layer 200 are packaged by the packaging layer 300 to protect the display panel, such that the integrity of the display panel is ensured.

As shown in FIG. 5, the substrate 10 includes a first substrate layer 14, a first water-oxygen barrier layer 15, an amorphous silicon layer 16, a second substrate layer 17, and a second water-oxygen barrier layer 18, which are sequentially laminated.

In the embodiments of the present disclosure, the display panel may be an OLED display panel. The OLED display panel generally includes OLED devices that are sensitive to water vapor and oxygen. When the OLED display panel is evaporated, the water-oxygen barrier layer may protect the OLED devices by preventing the water vapor and oxygen that generated during evaporation from entering into the OLED devices easily. As a result, the performance and service life of the OLED devices are not affected.

In the embodiments of the present disclosure, two substrate layers are arranged, and the first water-oxygen barrier layer 15 may be arranged between the first substrate layer 14 and the second substrate layer 17. That is, two water-oxygen barrier layers may be arranged in the display panel. Both the first water-oxygen barrier layer 15 and the second water-oxygen barrier layer 18 have a function of barriering water and oxygen, such that protection of the OLED devices is enhanced.

In the embodiments of the present disclosure, the first substrate layer 14 and the second substrate layer 17 are flexible substrate layers. The flexible substrate may be made of a flexible organic material, for example a resin-based material such as polyimide (PI), polycarbonate, polyacrylate, polyetherimide, polyethersulfone, polyethylene terephthalate, and polyethylene naphthalate.

In the embodiments of the present disclosure, the first water-oxygen barrier layer 15 and the second water-oxygen barrier layer 18 are silicon nitride layers, silicon oxide layers, or aluminum oxide layers.

In the embodiments of the present disclosure, the amorphous silicon layer 16 is an insulating layer, which ensures the insulation of the substrate 10 and prevents the substrate 10 from affecting the electrical connection of the thin film transistor array 100.

As shown in FIG. 5, a buffer layer 400 is arranged between the substrate 10 and the thin film transistor array 100. The buffer layer 400 is configured to protect the TFTs and ensure that the TFTs are separated from the substrate 10. In this way, foreign materials on the substrate are prevented from affecting the TFTs, so as to ensure normal operation of the TFTs. Meanwhile, manufacturing of the thin film transistor array 100 is facilitated.

In an exemplary embodiment, the buffer layer 400 may be a silicon oxide layer, a silicon nitride layer, or a silicon nitride layer, such that the insulation effect of the buffer layer 400 is ensured, that is the TFTs are separated from the substrate 10 by the buffer layer 400.

As shown in FIG. 5, the thin film transistor array 100 includes an active (Act) layer 114, a first gate insulating (GI) layer 115, a first gate layer 111, a second gate insulating layer 116, a second gate layer 112, an interlayer dielectric (ILD) layer 117, a source-drain (SD) layer 113, and an insulating layer 118, which are sequentially laminated.

In the embodiments of the present disclosure, the first gate insulating layer 115 is disposed between the active layer 114 and the first gate layer 111. The active layer 114 and the first gate layer 111 are ensured to be separated from each other by the first gate insulating layer 115, such that the active layer 114 and the first gate layer 111 are capable of transmitting signals independently. The second gate insulating layer 116 is disposed between the first gate layer 111 and the second gate layer 112. The first gate layer 111 and the second gate layer 112 are ensured to be separated from each other by the second gate insulating layer 116, such that the first gate layer 111 and the second gate layer 112 are capable of transmitting signals independently. The interlayer dielectric layer 117 is disposed between the second gate layer 112 and the source-drain layer 113, such that the second gate layer 112 and the source-drain layer 113 are ensured to transmit signals independently. The insulating layer 118 is disposed on the source-drain layer 113, and separates the thin film transistor array 100 from the light-emitting layer 200.

In the embodiments of the present disclosure, the material for manufacturing the active layer 114 may be any one of an indium gallium zinc oxide (IGZO), an azoic (AZO) compound, an indium zinc oxide (IZO), an amorphous indium-gallium-zinc oxide (a-IGZO), an indium zinc tin oxide (IZTO), a zinc oxynitride (ZnON), amorphous silicon, polycrystalline silicon (p-Si), hexathiophene and polythiophene. The above-mentioned materials have good light transmittance, which ensures the light transmittance of the active layer 114 and prevents the active layer 114 from affecting the display of the display panel.

In the embodiments of the present disclosure, the first gate insulating layer 115 and the second gate insulating layer 116 are inorganic insulating layers, such as a silicon nitride (SiN) insulating layer, or may be organic insulating layers, such as an epoxy resin insulating layer. The silicon nitride and the epoxy resin have a good electrical isolation, which ensures the electrical isolation of the first gate insulating layer 115 and the second gate insulating layer 116.

In the embodiments of the present disclosure, the interlayer dielectric layer 117 and the insulating layer 118 are inorganic insulating layers, such as a silicon nitride insulating layer, or may be organic insulating layers, such as an epoxy resin insulating layer. The silicon nitride and the epoxy resin have a good electrical isolation, which ensures the electrical isolation of the interlayer dielectric layer 117 and the insulating layer 118.

In the embodiments of the present disclosure, the first gate layer 111 and the second gate layer 112 are metal layers or indium tin oxide (ITO) layers. The indium tin oxide has a small resistivity, which prevents the first gate layer 111 and the second gate layer 112 from consuming too much electrical energy. Moreover, the indium tin oxide has good light transmittance, which prevents the first gate layer 111 and the second gate layer 112 from affecting the display effect of the display panel.

In the embodiments of the present disclosure, the source-drain layer 113 is a metal layer or indium tin oxide layer, which ensures the stability in transmitting electrical signals and light transmittance of the source-drain layer 113.

Further referring to FIG. 5, a planarization (PLN) layer 500 is provided between the thin film transistor array 100 and the light-emitting layer 200.

In the embodiments of the present disclosure, the planarization layer 500 may enable the surface of the thin film transistor array to be more flat, which facilitates the arrangement of the light-emitting layer 200. The planarization layer 500 may be a resin layer, and the resin has electrical isolation to ensure the electrical isolation of the planarization layer 500.

Referring to FIG. 5 again, the light-emitting layer 200 includes an anode layer 206, a pixel defining layer (PDL) 207, an organic light-emitting layer 208, a cathode layer 209, which are sequentially laminated on the planarization layer.

In the embodiments of the present disclosure, the anode layer 206 may be an indium tin oxide layer or a metal layer, which ensures the stability of the anode layer 206 in transmitting electrical signals. In addition, the indium tin oxide has a small resistivity, which prevents the anode layer 206 from consuming too much electrical energy.

In an exemplary embodiment, for example, the metal may be aluminum (Al), copper (Cu), molybdenum (Mo), chromium (Cr), titanium (Ti) and the like, or may be an alloy.

In the embodiments of the present disclosure, the cathode layer 209 may be an indium tin oxide layer or a metal layer, which ensures the stability of the cathode layer 209 in transmitting the electrical signals. In addition, the indium tin oxide has a small resistivity, which prevents the cathode layer 209 from consuming too much electrical energy. The materials of the anode layer 206 and the cathode layer 209 may be the same or different.

In the embodiments of the present disclosure, the pixel defining layer 207 is configured to separate respective sub-pixel regions of the organic light-emitting display from each other. That is, a plurality of sub-pixel regions are formed by recess structures of the pixel defining layer 207.

In an exemplary embodiment, the organic light-emitting layer 208 has light-emitting units distributed within the recesses of the pixel defining layer 207. The organic light-emitting layer 208 may include a hole transport layer, a light-emitting layer, and an electron transport layer, which are laminated.

Referring to FIG. 5 again, a spacer layer 600 is provided between the pixel defining layer 207 and the organic light-emitting layer 208, and is configured to support a mask plate during evaporation of the organic light-emitting layer 208.

As shown in FIG. 5, the packaging layer 300 includes a first inorganic packaging layer 303, an organic packaging layer 304 and a second inorganic packaging layer 305, which are sequentially laminated on the cathode layer 209.

In the embodiments of the present disclosure, a plurality of packaging layers are provided to ensure packaging effect.

In an exemplary embodiment, the packaging layer 300 may be in a package form of thin film to ensure packaging effect.

In the embodiments of the present disclosure, the at least two electrode layers 101 include the first gate layer 111, the second gate layer 112, and the source-drain layer 113 as described above.

In this embodiment, the gate layer and the source-drain layer are electrode layers in the display panel. Both the gate layer and the source-drain layer are conductive layers, and are configured to arrange the first trace thereon. The first trace 40 may be manufactured when the gate layer and the source-drain layer are manufactured, which facilitates the manufacturing of the first trace 40.

In an exemplary embodiment, the gate layer is configured to arrange the gate lines in the display panel thereon, and the source-drain layer is configured to arrange the data lines in the display panel thereon. The first trace 40, the gate lines on the gate layer, and the data lines on the source-drain layer are insulated from each other, so as to avoid affecting transmission of electrical signals.

In other embodiments, the display panel may include one gate layer and one source-drain layer, or may include two gate layers and two source-drain layers, which is not limited in the present disclosure.

In the embodiments of the present disclosure, the plurality of first signal pins 30 are disposed on any one of the at least two electrode layers 101.

In this embodiment, the first signal pins 30 are arranged on the electrode layer 101 of the display panel. The first signal pins 30 may be manufactured when the electrode layer 101 is manufactured. In this way, the manufacturing process is relatively convenient, and requires no additional film layer to arrange the first signal pins 30 thereon, which reduces the thickness of the display panel.

In the embodiments of the present disclosure, the first trace 40 electrically connecting at least two first pins 301 is disposed on a different layer from the third trace 60 electrically connecting at least two second pins 302.

In the embodiments of the present disclosure, the first trace 40 is electrically connected to the first pin 301, and the third trace 60 is electrically connected to the second pin 302. The first trace 40 and the third trace 60 are arranged on different film layers of different display panels to avoid intersection with each other, such that process difficulty is reduced. Meanwhile, the first trace 40 is prevented from being electrically connected to the third trace 60, such that the transmission of electrical signals is not affected.

Figure 6:
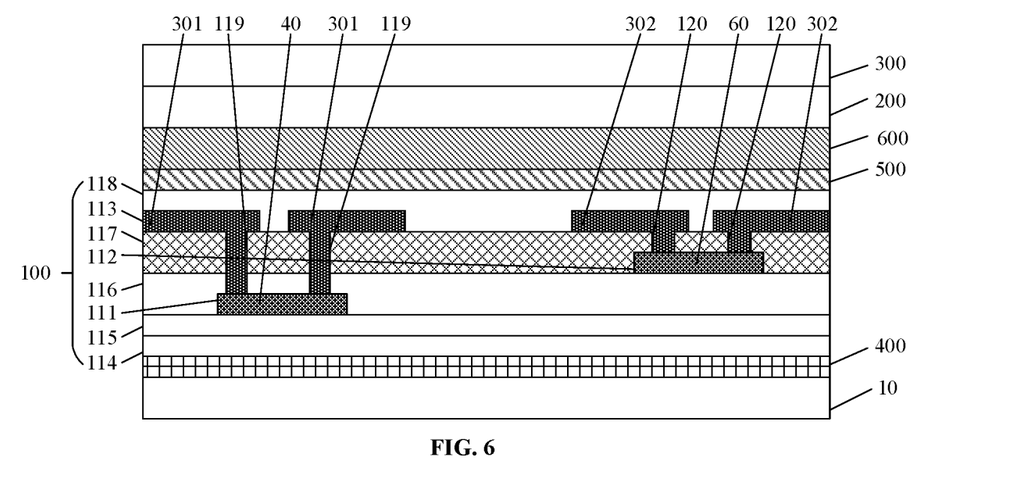
FIG. 6 is a cross-sectional view of a peripheral region of a display panel according to embodiments of the present disclosure.

FIG. 6 is a cross-sectional view of a peripheral region of a display panel according to the embodiments of the present disclosure. Referring to FIG. 6, the first pin 301 and the second pin 302 are disposed on the source-drain layer 113, the first trace 40 is disposed on the first gate layer 111, and the third trace 60 is disposed on the second gate layer 112. In this case, first via holes 119 may be arranged on the second gate insulating layer 116 between the first gate layer 111 and the source-drain layer 113, the second gate layer 112 and the interlayer dielectric layer 117. The first pin 301 and the first trace 40 are electrically connected via the first via hole 119. Second via holes 120 are arranged on the interlayer dielectric layer 117, and the second pins 302 and the third trace 60 are electrically connected via the second via hole 120.

In other embodiments, the first pin 301, the second pin 302, the first trace 40, and the third trace 60 may be disposed on other electrode layers. For example, the first pin 301 and the second pin 302 are disposed on the second gate layer 112, the first trace 40 is disposed on the first gate layer 111, and the third trace 60 is disposed on the source-drain layer 113, which is not limited in the present disclosure.

The following Table 1 provides details of a first signal pin 30.

TABLE 1

| Serial number | Name | Signal type |
|---|---|---|
| 1-10 | Dummy | |
| 11 | VSR_L[10] | MUX square wave |
| 12 | VGLR | |
| 13 | VSR_L[9] | MUX square wave |
| 14 | VGHR | |
| 15 | VSR_L[8] | MUX square wave |
| 16 | VREFP5 | |
| 17 | VSR_L[7] | MUX square wave |
| 18 | VREFP5 | |
| 19 | VSR_L[6] | MUX square wave |
| 20-29 | 2*VSR_R[1]-2*VSR_R[5] | MUX square wave |
| 30-49 | 2*SW_L[10]-2*SW_L[1] | GOA square wave |
| 50 | SW[21] | |
| 51-170 | S[121]-S[240] | Data signal |
| 171 | VGHR | |
| 172 | VGLR | |
| 173 | VREFP5 | |
| 174-193 | SW[20]-SW[1] | GOA square wave |
| 194 | VREFP5 | |
| 195 | VGLR | |
| 196 | VGHR | |
| 197-316 | S[1]-S[120] | Data signal |
| 317-336 | 2*SW_R[1]-2*SW_R[10] | GOA square wave |
| 337-346 | 2*VSR_R[5]-2*VSR_R[1] | MUX square wave |
| 347 | VSR_R[6] | MUX square wave |
| 348 | VREFP5 | |
| 349 | VSR_R[7] | MUX square wave |
| 350 | VREFP5 | |
| 351 | VSR_R[8] | MUX square wave |
| 352 | VGHR | |
| 353 | VSR_R[9] | MUX square wave |
| 354 | VGLR | |
| 355 | VSR_R[10] | MUX square wave |
| 356-365 | DMY*10 | |

The serial number indicates the sequence of the pins. For example, the pins may be arranged in each row in the peripheral region 2 in a sequence of 1 to 365 from left to right, or may be arranged in a sequence of 1 to 365 from right to left.

In the embodiments of the present disclosure, the first signal pins 30 are divided into two rows. The row proximal to the display region is arranged with even-serial numbers pins, and the row distal from the display region is arranged with odd-serial number pins.

In Table 1, Dummy refers to a dummy pin that is not connected to a signal line and does not transmit an actual signal. VGL (voltage gate low) refers to gate low level, R refers to right side, and VGH (voltage gate high) refers to gate high level. That is, a VGLR pin is a gate low level pin on the right side, and a VGHR pin is a gate high level pin on the right side. VREF (voltage reference) refers to reference voltage, and VREFP5 refers to a 5V-reference voltage pin that is connected to a 5V voltage supply. That is, the VREFP5 pin transmits a 5V-reference voltage signal. The VREFP5 pin is grounded, that is, the VREFP5 pin has a voltage of 0V. SW (switch) refers to a switch pin. [n] refers to a serial number of the pin in a specific type. GOA square wave refers to a GOA signal.

The switch circuit 201 includes a multiplexer (MUX) 219. In FIG. 1, the multiplexer 219 is disposed between the display region 1 and the fanout region 21. In FIG. 2, the multiplexer 219 is disposed in a lower half circle of the circular display region.

Figure 7:
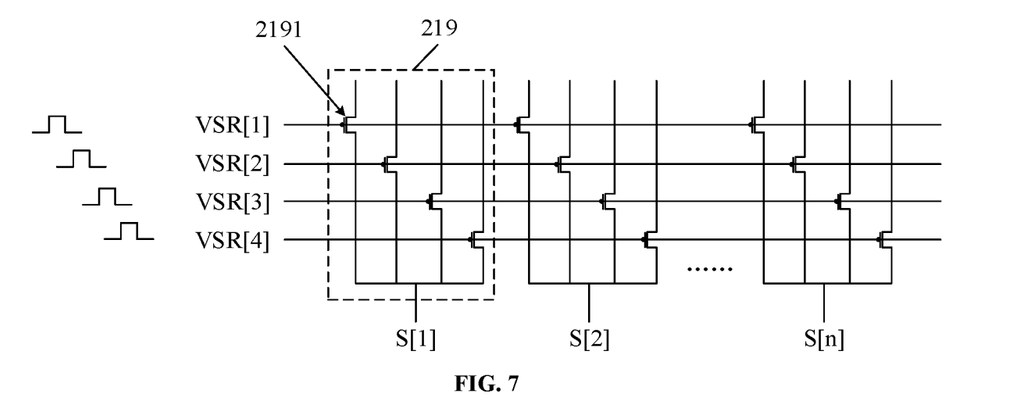
FIG. 7 is a circuit diagram of a multiplexer unit according to embodiments of the present disclosure.

FIG. 7 is a circuit diagram of a multiplexer unit according to the embodiments of the present disclosure. Referring to FIG. 7, the multiplexer 219 includes a plurality of thin film transistors 2191. S pins are electrically connected to sources of the thin film transistors, and drains of the thin film transistors are electrically connected to a plurality columns of pixel circuits. A VSR pin is electrically connected to the gates of the thin film transistors disposed in a same row of the plurality of multiplexers 219. In FIG. 7, in a case that the VSR[1] pin provides an on level and the other VSR pins provide a non-on level. The first thin film transistor in each of the plurality of multiplexers 219 is turned on and provides a data signal to the pixel circuit electrically connected to the thin film transistor. FIG. 7 is illustrated by taking four thin film transistors as an example. In other embodiments, MUX may further include six or eight thin film transistors, which is not limited in the present disclosure.

In the embodiments of the present disclosure. MUX square wave refers to multiplexer signal. VSR refers to vertical shift register, L refers to left side, and R refers to right side. That is, a VSR_L pin is the pin of the vertical shift register on the left side, and a VSR_R pin is the pin of the vertical shift register on the right side. A S (source) pin is data pin outputting a data signal to the pixel circuit.

Both the VSR pin and the S pin are electrically connected to the multiplexer 219, and the multiplexer 219 may further be electrically connected to a plurality of columns of pixel circuits. In this way, the VSR pin outputs a control signal to the multiplexer 219, and controls the multiplexer 219 to output the data signal provided by the S pin to a specific column of pixel circuits. A VSR pin may correspond to a plurality of data signals. That is, a VSR pin is electrically connected to a plurality of multiplexers 219.

In the embodiments of the present disclosure, the first pin 301 is a VSR pin.

In this embodiment, the VSR pin is electrically connected to the pixel circuit 204 in the display region via the multiplexer 219, and one VSR pin is electrically connected to a plurality of pixel circuits 204. The drive integrated circuit 22 controls the on-off state of the thin film transistor 2191 in the multiplexer 219 via the VSR pin, so as to control the signal provided to the pixel circuits 204. As a result, the display panel is controlled to display a screen.

In the embodiments of the present disclosure, the at least two first pins 301 include 30 VSR pins.

In this embodiment, a plurality of VSR pins are arranged on the display panel, and the plurality of VSR pins may output a same signal. The plurality of VSR pins are electrically connected, such that voltage signals output to the pixel circuit by the VSR pins are balanced. In this way, a voltage signal output to the light-emitting element by the drive circuit 20 is balanced, which improves the uniformity and stability of the voltage signal. As a result, the display effect of the display panel is improved.

As shown in FIG. 4, the first signal pins 30 are arranged in two rows, wherein 10 VSR pins are provided in the first row proximal to the display region 1, and 20 VSR pins are provided in the second row distal from the display region 1.

In this embodiment, the first signal pins 30 are arranged in two rows, and are uniformly arranged on the substrate 10. The VSR pins are uniformly distributed in the two rows of the first signal pins, which facilitates the arrangement of the leads electrically connected to the VSR pins.

In the embodiments of the present disclosure, the VSR pins in Table 1 are the 15 VSR_L pins numbered 11, 13, 15, 17, 19, and 20 to 29, and the 15 VSR_R pins numbered 337 to 347, 349, 351, 353, and 355.

In the embodiments of the present disclosure, the first pin 301 is a light-emitting control drive switch pin. The light-emitting control drive switch pin is electrically connected to the light-emitting control circuit 203.

In the embodiments of the present disclosure, a light-emitting control circuit 203 is electrically connected to a plurality of pixel circuits. The drive integrated circuit provides light-emitting signals to the pixel circuits via the light-emitting control circuit 203, such that the display is controlled to display a screen.

In the embodiments of the present disclosure, the first signal pins 30 include 20 light-emitting control drive switch pins.

In the embodiments of the present disclosure, a plurality of light-emitting control drive switch pins are arranged on the display panel, and the plurality of light-emitting control drive switch pins output a same signal. The plurality of light-emitting control drive switch pins are electrically connected, such that voltage signals output to the light-emitting control circuit 203 by the light-emitting driving control switch pins are balanced. In this way, a voltage signal output to the light-emitting element by the drive circuit 20 is balanced, which improves the uniformity and stability of the voltage signal. As a result, the display effect of the display panel is improved.

In the embodiments of the present disclosure, the light-emitting control drive switch pins are the 20 SW_L pins numbered 30 to 49 in Table 1.

In the embodiments of the present disclosure, the first pin 301 is a gate drive switch pin. The gate drive switch pins are electrically connected to the gate driver on array 202.

In the embodiments of the present disclosure, one gate driver on array 202 may be electrically connected to a plurality of pixel circuits 204. The drive integrated circuit provides gate drive signals to the pixel circuits via the gate driver on array 202.

In the embodiments of the present disclosure, the first signal pins 30 include 20 gate drive switch pins.

In the embodiments of the present disclosure, the gate drive switch pins are the 20 SW_R pins numbered 317 to 336 in Table 1.

The embodiments of the present disclosure further provide a display device, and the display device includes the display panel shown in any one of the preceding figures.

During the specific implementation, the display device provided by the embodiments of the present disclosure may be any product or component with a display function, such as an electronic watch, a mobile phone, a tablet computer, a TV set, a monitor, a notebook computer, a digital photo frame, a navigator and the like.

Described above are merely optional embodiments of the present disclosure, and are not intended to limit the present disclosure. Within the spirit and principles of the disclosure, any modifications, equivalent replacements, improvements, and the like are within the protection scope of the present disclosure.

What is claimed is:

1. A display panel, provided with a display region and a peripheral region surrounding the display region, the display panel comprising:
   a substrate;
   a drive circuit, disposed on the substrate and in the peripheral region, wherein the drive circuit is configured to control pixels to emit light; and
   a plurality of first signal pins, disposed on the substrate and spaced apart in the peripheral region, wherein the plurality of first signal pins are electrically connected to the drive circuit;
   wherein the plurality of first signal pins comprise at least two first pins, the at least two first pins being electrically connected via a first trace, and the at least two first pins that are electrically connected being connected to the drive circuit via a same second trace, wherein the second trace is configured to transmit electrical signals to the drive circuit.

2. The display panel according to claim 1, wherein the display panel comprises at least two electrode layers sequentially laminated and insulated from each other, the at least two electrode layers being disposed on the substrate;
   wherein the first trace is disposed on any one of the at least two electrode layers.

3. The display panel according to claim 2, wherein the at least two electrode layers comprise a first gate layer, a second gate layer, and a source-drain layer.

4. The display panel according to claim 1, wherein the first pin is a vertical shift register pin; and
   the drive circuit comprises a switch circuit, wherein the switch circuit is disposed on the substrate and in the peripheral region, and the vertical shift register pin is electrically connected to the switch circuit.

5. The display panel according to claim 4, wherein the plurality of first signal pins comprise 30 vertical shift register pins.

6. The display panel according to claim 1, wherein the first pin is a gate drive switch pin; and
   the drive circuit comprises a gate driver on array, wherein the gate driver on array is disposed on the substrate and in the peripheral region, and the gate drive switch pin is electrically connected to the gate driver on array.

7. The display panel according to claim 6, wherein the plurality of first signal pins comprise 20 gate drive switch pins.

8. The display panel according to claim 1, wherein the first pin is a light-emitting control drive switch pin; and the drive circuit comprises a light-emitting control circuit, wherein the light-emitting control circuit is disposed on the substrate and in the peripheral region, and the light-emitting control drive switch pin is electrically connected to the light-emitting control circuit.

9. The display panel according to claim 8, wherein the plurality of first signal pins comprise 20 light-emitting control drive switch pins.

10. The display panel according to claim 1, wherein the plurality of first signal pins comprise at least two second pins, the at least two second pins being electrically connected.

11. The display panel according to claim 10, wherein the first trace electrically connecting the at least two first pins is disposed on a different layer from a third trace electrically connecting the at least two second pins.

12. The display panel according to claim 1, further comprising:
    second signal pins, electrically connected to a flexible printed circuit, wherein the first signal pins are arranged in two rows, the second signal pins are arranged in one row, and the three rows of signal pins are arranged in parallel.

13. The display panel according to claim 12, wherein the display panel further comprises a drive integrated circuit disposed in the peripheral region; and
    the second signal pins are electrically connected to input pins on the drive integrated circuit.

14. The display panel according to claim 1, wherein the display panel further comprises a drive integrated circuit disposed in the peripheral region; and
    the plurality of first signal pins are electrically connected to output pins on the drive integrated circuit in one-to-one correspondence, and the drive integrated circuit outputs a same signal to the at least two first pins that are electrically connected.

15. A display device, comprising a display panel provided with a display region and a peripheral region surrounding the display region, the display panel comprising:
    a substrate;
    a drive circuit, disposed on the substrate and in the peripheral region, wherein the drive circuit is configured to control pixels to emit light; and
    a plurality of first signal pins, disposed on the substrate and spaced apart in the peripheral region, wherein the plurality of first signal pins are electrically connected to the drive circuit;
    wherein the plurality of first signal pins comprise at least two first pins, the at least two first pins being electrically connected via a first trace, and the at least two first pins that are electrically connected being connected to the drive circuit via a same second trace, wherein the second trace is configured to transmit electrical signals to the drive circuit.

16. The display device according to claim 15, wherein the display panel comprises at least two electrode layers sequentially laminated and insulated from each other, the at least two electrode layers being disposed on the substrate;
    wherein the first trace is disposed on any one of the at least two electrode layers.

17. The display device according to claim 16, wherein the at least two electrode layers comprise a first gate layer, a second gate layer, and a source-drain layer.

18. The display device according to claim 15, wherein the first pin is a vertical shift register pin; and
    the drive circuit comprises a switch circuit, wherein the switch circuit is disposed on the substrate and in the peripheral region, and the vertical shift register pin is electrically connected to the switch circuit.

19. The display device according to claim 15, wherein the display panel further comprises a drive integrated circuit disposed in the peripheral region; and
    the plurality of first signal pins are electrically connected to output pins on the drive integrated circuit in one-to-one correspondence, and the drive integrated circuit outputs a same signal to the at least two first pins that are electrically connected.

20. The display device according to claim 15, wherein the display panel further comprises a drive integrated circuit disposed in the peripheral region; and
    the second signal pins are electrically connected to input pins on the drive integrated circuit.

* * * * *